United States Patent
Kim

(10) Patent No.: US 7,888,979 B2
(45) Date of Patent: Feb. 15, 2011

(54) PAD INPUT SIGNAL PROCESSING CIRCUIT

(75) Inventor: Keun Kook Kim, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 53 days.

(21) Appl. No.: 12/315,024

(22) Filed: Nov. 26, 2008

(65) Prior Publication Data

US 2009/0302914 A1 Dec. 10, 2009

(30) Foreign Application Priority Data

Jun. 4, 2008 (KR) .................. 10-2008-0052693

(51) Int. Cl.
*H03L 7/00* (2006.01)
(52) U.S. Cl. ..................... 327/143; 327/309
(58) Field of Classification Search .......... 327/142, 327/143, 309, 318
See application file for complete search history.

(56) References Cited

U.S. PATENT DOCUMENTS

| 6,038,116 A | 3/2000 | Holberg et al. |
| 6,690,222 B2 | 2/2004 | Nair |
| 6,998,884 B2 * | 2/2006 | Ng et al. ............... 327/143 |
| 7,586,350 B2 * | 9/2009 | Chung et al. .......... 327/198 |

FOREIGN PATENT DOCUMENTS

| KR | 10-0184508 B1 | 12/1998 |
| KR | 10-2003-0047074 A | 6/2003 |
| KR | 10-2003-0052362 A | 6/2003 |

* cited by examiner

*Primary Examiner*—Jeffrey S Zweizig
(74) *Attorney, Agent, or Firm*—John P. White; Cooper & Dunham LLP

(57) ABSTRACT

A pad input signal processing circuit includes a control unit for setting a level of a pad output terminal to which a first control signal is input in response to a power up signal, and a signal output unit for outputting a command signal in response to a signal of the pad output terminal and a second control signal.

17 Claims, 3 Drawing Sheets

US 7,888,979 B2

PAD INPUT SIGNAL PROCESSING CIRCUIT

TECHNICAL FIELD

The present disclosure relates to a semiconductor memory and, more particularly, to a pad input signal processing circuit for processing a deep power down mode signal received through a pad in a mobile DRAM.

BACKGROUND

Generally, a semiconductor memory stores data or outputs stored data to an exterior by operating periphery circuits in an active state, and minimizes power consumption by disabling unnecessary periphery circuits in a stand-by state.

In particular, in order to minimize unnecessary power consumption in a stand-by mode, a mobile semiconductor memory enters a deep power down (DPD) mode to stop operations of periphery circuits. There are two ways of entering the deep power down mode, one is by a pad and the other is by a command. A user can select one of these two ways and generally the memory is configured to allow the user to make such selection by fuse cutting.

FIG. 1 is a circuit diagram illustrating a conventional pad input signal processing circuit.

Referring to FIG. 1, the conventional pad input signal processing circuit shown therein is configured to enter the DPD mode by a command or a pad, as selected using fuse option.

Referring to the DPD mode entry by a command, a pad input terminal becomes a logic low level through NMOS transistors which are turned on in response to a power supply voltage VDD. Therefore, a signal DPD_PAD which went through an input buffer always becomes a logic low level. A signal CMD_DPD is a signal that becomes a logic high level in the case of entering the DPD mode by a command and a deep power down mode signal is controlled only by the signal CMD_DPD.

Referring to the DPD mode entry by a pad, a fuse connected to the pad input terminal is cut and at the DPD mode entry, a logic high level is applied from an external pin connected to the pad. Since the signal CMD_DPD by a command always maintains a logic low level, the deep power down mode signal is controlled by an external pin.

However, such a conventional technique requires the cutting of a fuse when entering the DPD mode by a pad. If a memory enters the DPD mode by a pad without cutting a fuse, it does not have any operational problem. However, when entering the DPD mode by a pad, there is a problem of current consumption through a fuse and NMOS transistors under the condition that the pad input terminal is in a logic high level. Such unnecessary current consumption is critical in the DPD mode in which current specification is several μA. In addition, since the fuse cutting is post-processed upon the request from an orderer, it is difficult to keep stocks, resulting in late customer response.

SUMMARY

In an aspect of the present disclosure, a pad input signal processing circuit is provided that avoids unnecessary current consumption, such as is present in conventional pad input signal processing circuits, regardless of the way of entering a deep power down mode, while not cutting a fuse.

In an exemplary embodiment, a pad input signal processing circuit includes a control unit for setting a level of a pad output terminal to which a first control signal is input in response to a power up signal, and a signal output unit for outputting a command signal in response to a signal of the pad output terminal and a second control signal.

The first control signal is a deep power down mode entry signal activated by a pad.

The second control signal is a deep power down mode entry signal activated by a command.

The command signal is a deep power down mode signal.

The control unit drives the pad output terminal to a certain logic level when the power up signal is activated.

In another exemplary embodiment, a pad input signal processing circuit includes a pad, an control signal generating unit configured to generate a control signal to control the pad output terminal to which a first control signal is input in response to a power up signal, a current sink unit for driving the pad output terminal in response to an output signal of the control signal generating unit, and a signal output unit for outputting a command signal in response to a signal of the pad output terminal and a second control signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, examples and exemplary embodiments of the present disclosure will be described with reference to accompanying drawings. However, the examples and embodiments are for illustrative purposes only and are not intended to limit the scope of the invention.

Figure 1:
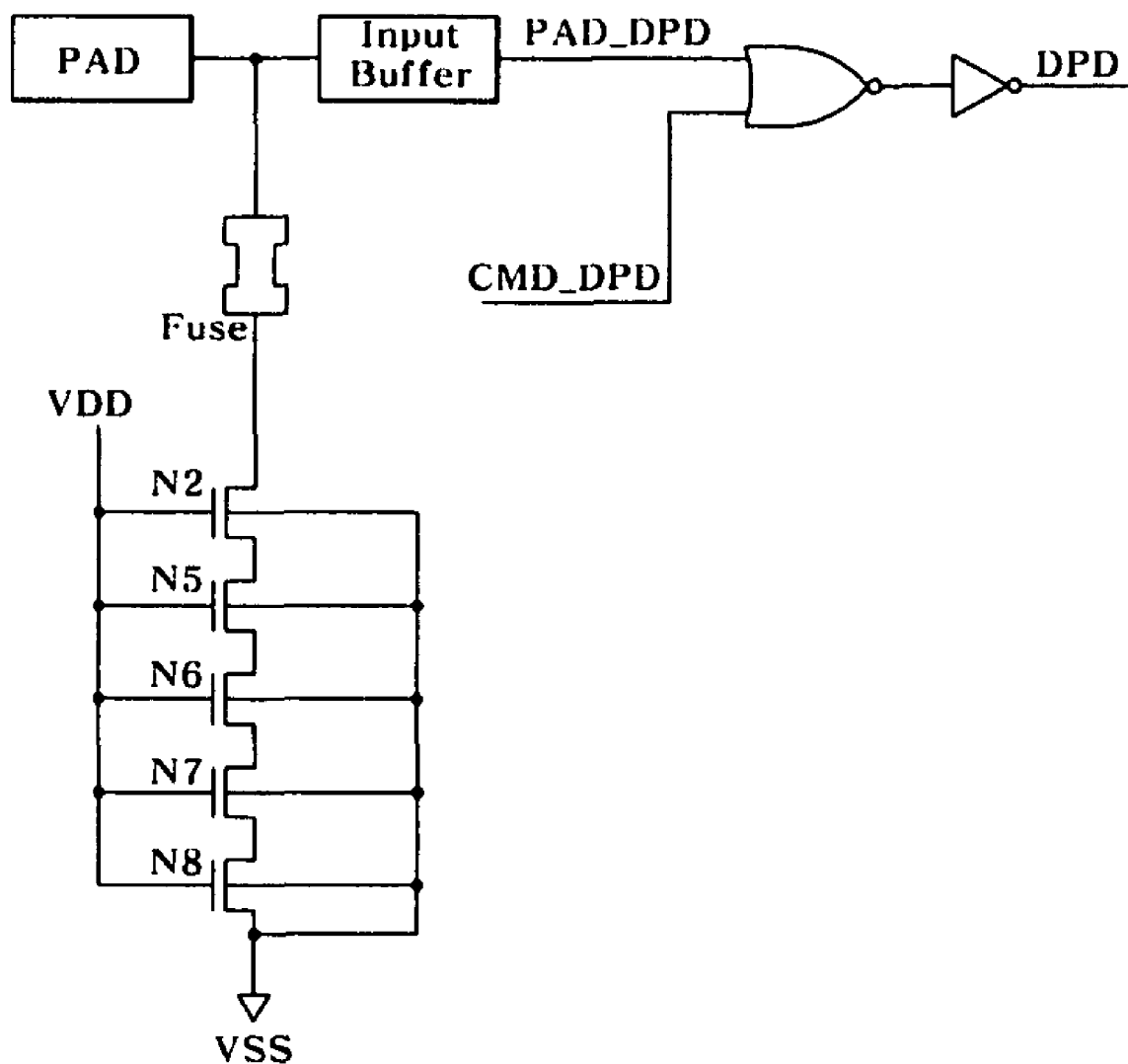
FIG. 1 is a circuit diagram illustrating a conventional pad input signal processing circuit.
Figure 2:
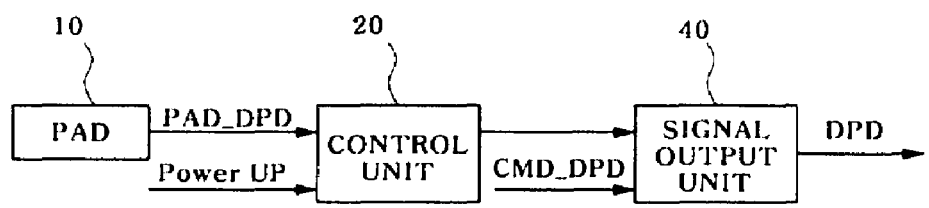
FIG. 2 is a block diagram illustrating a pad input signal processing circuit according to an embodiment of this disclosure.
Figure 3:
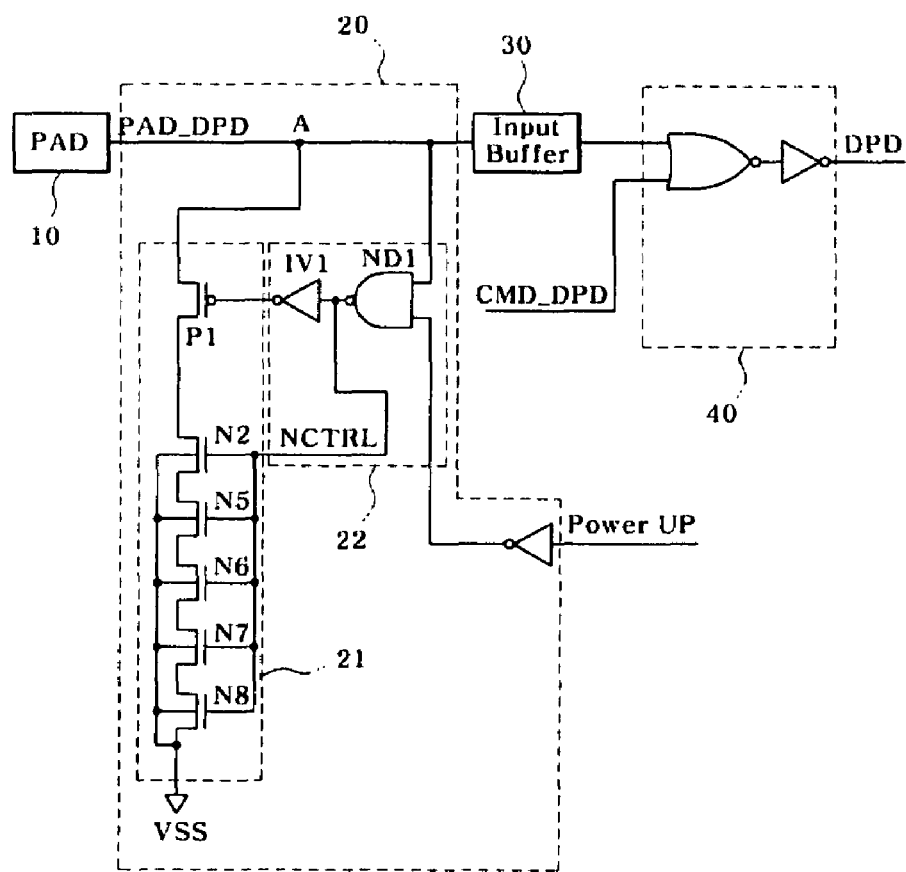
FIG. 3 is a circuit diagram illustrating a pad input signal processing circuit according to another embodiment of this disclosure.

FIG. 2 is a block diagram illustrating a pad input signal processing circuit (2), in an embodiment of this disclosure, and FIG. 3 is a circuit diagram illustrating a pad input signal processing circuit (3), similar to the pad input signal processing circuit 2 of FIG. 2 except that a buffer (30) is provided additionally in the pad input signal processing circuit 3.

Referring to FIGS. 2 and 3, each of the pad input signal processing circuits (2, 3) includes a pad 10, a control unit 20 for controlling a pad output terminal A to which a first control signal PAD_DPD is input in response to a power up signal PowerUp, and a signal output unit 40 for outputting a deep power down signal DPD in response to a signal of the pad output terminal A and a second control signal CMD_DPD.

Here, the first control signal PAD_DPD is a signal which is activated at the time of entering the deep power down mode by a pad, the second control signal CMD_DPD is a signal which is activated at the time of entering the deep power down mode by a command, and the power up signal PowerUp is a signal which is transited to a logic low level when a power supply voltage VDD increases to a high enough level at the power up.

The control unit 20 includes the control signal generating unit 22 for performing a logic operation in response to the first control signal PAD_DPD and the power up signal PowerUp, and a current sink unit 21 which is driven in response to an output signal of the control signal generating unit 22. When the power up signal PowerUp is activated, the current sink unit 21 is turned on, and when the first control signal PAD_DPD is activated, the current sink unit 21 is turned off.

The control signal generating unit 22 includes a first logic element ND1 for performing a NAND operation on the first control signal PAD_DPD and an inverted signal of the power up signal, and a second logic element IV1 for inverting and outputting an output signal NCTRL of the first logic element ND1.

The current sink unit 21 includes a plurality of first NMOS transistors N2, N5, N6, N7 and N8 which are connected in series with one another and performs pull-down driving in response to the output signal NCTRL of the first logic element ND1, and a first PMOS transistor P1 which is connected in series with the first NMOS transistors and pull-down drives the pad output terminal A in response to an output signal of the second logic element IV1.

A buffer 30 is provided in the pad input signal processing circuit 3 of FIG. 3 to buffer the control signal PAD_DPD between the control unit 20 and the signal output unit 40. More specifically, the buffer 30 buffers an output signal of the pad output terminal A and outputs the output signal to the signal output unit 40.

The signal output unit 40 includes a for performing an OR operation in response to the output signal of the input buffer 30 and the second control signal CMD_DPD and outputting a deep power down mode signal DPD. That is, the signal output unit 40 activates and outputs the deep power down mode signal DPD when the first control signal PAD_DPD or the second control signal CMD_DPD is activated.

Figure 4:
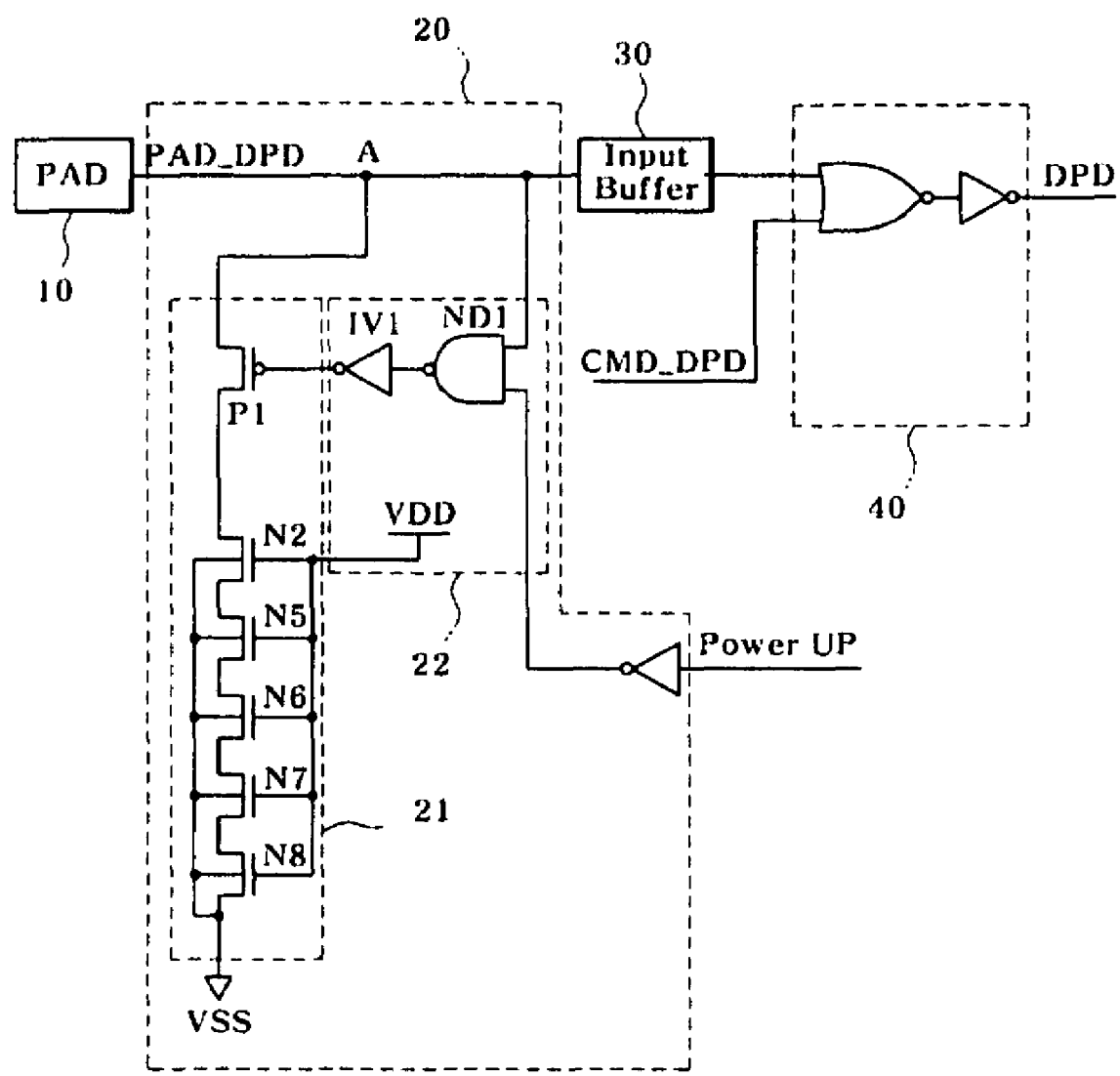
FIG. 4 is a circuit diagram illustrating a pad input signal processing circuit according to another embodiment of this disclosure.

FIG. 4 is a circuit diagram illustrating a pad input signal processing circuit according to another exemplary embodiment of this disclosure. The current sink unit 21 of FIG. 3 is driven in response to the output signal NCTRL of the first logic element ND1, but the current sink unit may also be configured to constantly perform a pull-down driving in response to the power supply voltage VDD as shown in FIG. 4.

Operation of a pad input signal processing circuit according to the embodiments of this disclosure configured as described above will be discussed in detail with reference to the accompanying drawings.

First, operation when the deep power down mode is entered through a command is as follows.

Since the pad 10 is not connected to anything, at the time of the power up, the first PMOS transistor P1 connected to the pad output terminal A is turned on in response to an inverted signal of the output signal NCTRL of the first logic element ND1, and the first NMOS transistors are turned on in response to the output signal NCTRL of the first logic element ND1. Then the pad output terminal A is set to a logic low level.

Accordingly, this disclosure is controlled to enter or exit from the deep power down mode by the command signal CMD_DPD.

Next, operation when the deep power down mode is entered through a pad is as follows.

In the beginning, the pad output terminal A is set to a logic low level by the power up signal. Thereafter, the power up is completed, and if a logic high level is applied to the pad, the first logic element ND1 outputs a logic low level signal.

Then the first NMOS transistors N2, N5, N6, N7 and N8 are turned off in response to the output signal NCTRL of the first logic element ND1, and the first PMOS transistor P1 is turned off in response to an inverted signal of the output signal NCTRL of the first logic element ND1.

Therefore, the first NMOS transistors N2, N5, N6, N7 and N8 and the first PMOS transistor P1 are controlled to be turned off at the time of entering the deep power down mode by a pad, thus preventing unnecessary current consumption which occurs in the prior art circuit.

As described above, the pad input signal processing circuit of this disclosure can avoid unnecessary current consumption, regardless of the way of entering the deep power down mode. In addition, by removing a fuse, the pad input signal processing circuit of this disclosure does not follow the pre-order and post-process method and can provide an identical wafer in the pre-process regardless of the required deep power down mode entry option, thereby making it easy to manage stocks and reducing considerable time in responding to customers' order.

Although examples and exemplary embodiments of the present invention have been described for illustrative purposes, those skilled in the art will appreciate that various modifications, additions and substitutions are possible, without departing from the scope and spirit of the invention as disclosed in the accompanying claims.

The present disclosure claims priority to Korean application 10-2008-0052693, filed on Jun. 4, 2008, the entire contents of which are incorporated herein by reference.

What is claimed is:

1. A pad input signal processing circuit comprising:
   a control unit configured to set a level of a pad output terminal in response to a power up signal and the level of the pad output terminal; and
   a signal output unit configured to output a command signal in response to a first control signal and a second control signal, wherein the first control signal is a deep power down mode entry signal which is supplied to the pad output terminal, and the second control signal is a deep power down mode entry signal activated by a command.

2. The pad input signal processing circuit of claim 1, wherein the command signal is a deep power down mode signal.

3. The pad input signal processing circuit of claim 1, further comprising an input buffer configured to buffer an output signal of the pad output terminal and output the output signal to the signal output unit.

4. The pad input signal processing circuit of claim 1, wherein the control unit comprises:
   a control signal generating unit configured to perform a logic operation in response to the first control signal and the power up signal; and
   a current sink unit configured to drive the pad output terminal in response to an output signal of the control signal generating unit;
   wherein if the power up signal is activated, the current sink unit is turned on to drive the pad output terminal to a certain logic level, and if the first control signal is activated, the current sink unit is turned off.

5. The pad input signal processing circuit of claim 4, wherein the control signal generating unit includes:
   a first logic element for performing a NAND operation in response to the first control signal and an inverted signal of the power up signal; and a second logic element for inverting and outputting an output signal of the first logic element.

6. The pad input signal processing circuit of claim 4, wherein the current sink unit includes:
   a plurality of first NMOS transistors connected in series with one another and configured to perform pull-down driving in response to an output signal of the first logic element; and
   a first PMOS transistor connected in series to the first NMOS transistors and configured to pull-down drive the pad output terminal in response to an output signal of the second logic element.

7. The pad input signal processing circuit of claim 4, wherein the current sink unit includes:
   a plurality of first NMOS transistors connected in series with one another and configured to perform pull-down driving in response to a power supply voltage signal; and
   a first PMOS transistor connected in series to the first NMOS transistors and configured to pull-down drive the pad output terminal in response to an output signal of the second logic element.

8. The pad input signal processing circuit of claim 1, wherein the signal output unit includes a operating unit for outputting a command signal in response to the first control signal and the second control signal.

9. The pad input signal processing circuit of claim 8, wherein the operating unit includes a third logic element for performing an OR operation, and outputting the command signal which is activated when the first control signal or the second control signal is activated.

10. A pad input signal processing circuit comprising:
    a pad;
    an operating unit configured to perform a logic operation in response to a power up signal and a level of pad output terminal;
    a current sink unit configured to drive the pad output terminal in response to an output signal of the operating unit; and
    a signal output unit configured to output a command signal in response to the first control signal and a second control signal, wherein the first control signal is a deep power down mode entry signal which is supplied to the pad output terminal via the pad, and the second control signal is a deep power down mode entry signal activated by a command.

11. The pad input signal processing circuit of claim 10, wherein the command signal is a deep power down mode signal.

12. The pad input signal processing circuit of claim 10, further comprising an input buffer for buffering an output signal of the pad and outputting the output signal to the signal output unit.

13. The pad input signal processing circuit of claim 10, wherein the operating unit comprises:
    a first logic element for performing a NAND operation in response to the first control signal and an inverted signal of the power up signal; and
    a second logic element for inverting and outputting an output signal of the first logic element.

14. The pad input signal processing circuit of claim 10, wherein the current sink unit includes:
    a plurality of first NMOS transistors connected in series with one another and configured to perform pull-down driving in response to an output signal of the first logic element; and
    a first PMOS transistor connected in series to the first NMOS transistors and configured to pull-down drive the pad output terminal in response to an output signal of the second logic element.

15. The pad input signal processing circuit of claim 10, wherein the current sink unit includes:
    a plurality of first NMOS transistors connected in series with one another and configured to perform pull-down driving in response to a power supply voltage signal; and
    a first PMOS transistor connected in series to the first NMOS transistors and configured to pull-down drive the pad output terminal in response to an output signal of the second logic element.

16. The pad input signal processing circuit of claim 10, wherein the signal output unit includes a operating unit for outputting the command signal in response to the first control signal and the second control signal.

17. The pad input signal processing circuit of claim 16, wherein the operating unit includes a third logic element for performing an OR operation, and outputting the command signal which is activated when the first control signal or the second control signal is activated.

* * * * *